United States Patent
Chun et al.

(10) Patent No.: US 9,472,261 B1
(45) Date of Patent: Oct. 18, 2016

(54) SYSTEMS AND METHODS TO REFRESH DRAM BASED ON TEMPERATURE AND BASED ON CALIBRATION DATA

(71) Applicant: QUALCOMM Incorporated, San Diego, CA (US)

(72) Inventors: Dexter Tamio Chun, San Diego, CA (US); Jung Pill Kim, San Diego, CA (US); Yanru Li, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/690,204

(22) Filed: Apr. 17, 2015

(51) Int. Cl.
| | | |
|---|---|---|
| *G11C 5/00* | (2006.01) | |
| *G11C 7/00* | (2006.01) | |
| *G11C 29/00* | (2006.01) | |
| *G11C 7/04* | (2006.01) | |
| *G11C 11/406* | (2006.01) | |
| *G11C 11/4096* | (2006.01) | |
| *G11C 29/42* | (2006.01) | |
| *G11C 29/36* | (2006.01) | |

(52) U.S. Cl.
CPC ...... *G11C 11/40626* (2013.01); *G11C 11/4096* (2013.01); *G11C 29/36* (2013.01); *G11C 29/42* (2013.01)

(58) Field of Classification Search
USPC ........................ 365/52, 200, 201, 211, 222
See application file for complete search history.

(56) References Cited

U.S. PATENT DOCUMENTS

| | | | |
|---|---|---|---|
| 5,956,289 A | 9/1999 | Norman et al. | |
| 6,483,764 B2 * | 11/2002 | Chen Hsu | G11C 11/406 365/222 |
| 7,177,220 B2 * | 2/2007 | Chou | G11C 11/406 365/222 |
| 7,233,538 B1 | 6/2007 | Wu et al. | |
| 7,266,031 B2 * | 9/2007 | Kim | G11C 11/406 365/211 |
| 7,275,130 B2 | 9/2007 | Klein | |
| 7,318,183 B2 | 1/2008 | Ito et al. | |
| 7,444,577 B2 * | 10/2008 | Best | G11C 11/406 365/201 |
| 7,944,761 B2 * | 5/2011 | Choi | G11C 7/1051 365/200 |
| 8,042,022 B2 | 10/2011 | Ito et al. | |
| 8,081,532 B2 * | 12/2011 | Walker | G01K 7/425 365/211 |
| 8,363,487 B2 * | 1/2013 | Ehrenreich | G11C 16/349 365/200 |
| 8,621,324 B2 | 12/2013 | Suh | |
| 2014/0029367 A1 | 1/2014 | Jung et al. | |

OTHER PUBLICATIONS

Partial International Search Report—PCT/US2016/027761—ISA/EPO—Jul. 18, 2016.

* cited by examiner

*Primary Examiner* — Trong Phan
(74) *Attorney, Agent, or Firm* — Toler Law Group, PC

(57) ABSTRACT

A system and method of refreshing dynamic random access memory (DRAM) are disclosed. A device includes a DRAM, a bus, and a system-on-chip (SOC) coupled via the bus to the DRAM. The SOC is configured to refresh the DRAM at a particular refresh rate based on a temperature of the DRAM and based on calibration data determined based on one or more calibration tests performed while the SOC is coupled to the DRAM.

20 Claims, 7 Drawing Sheets

SYSTEMS AND METHODS TO REFRESH DRAM BASED ON TEMPERATURE AND BASED ON CALIBRATION DATA

I. FIELD OF DISCLOSURE

The present disclosure is generally related to systems and method to refresh DRAM.

II. DESCRIPTION OF RELATED ART

Advances in technology have resulted in smaller and more powerful computing devices. For example, a variety of electronic devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Electronic devices may use volatile random access memory (RAM). The volatile RAM may spend a substantial amount of time in a power saving mode (e.g., a sleep mode or a standby mode). Devices using volatile RAM may use a refresh function or operation to keep memory contents refreshed during the power saving mode, which consumes power and drains the battery of the device.

III. SUMMARY

Calibration tests may be performed on a dynamic random access memory (DRAM) at one or more temperatures and at one or more refresh rates while the DRAM is coupled to a system on chip (SOC) (e.g., after the DRAM and the SOC are assembled in a consumer device). The SOC may use temperature information and calibration data to select or determine a refresh rate that will reduce power consumption to a level that will not result in more errors than would result from an error correction code (ECC) scheme employed by the SOC is capable of correcting.

In a particular aspect, a device includes a DRAM, a bus, and a SOC coupled via the bus to the DRAM. The SOC is configured to refresh the DRAM at a particular refresh rate based on a temperature of the DRAM and based on calibration data determined based on one or more calibration tests performed while the SOC is coupled to the DRAM.

In a particular aspect, a method includes determining, at a SOC, a temperature of a DRAM coupled to the SOC. The method further includes determining, at the SOC, a particular refresh rate at which to refresh the DRAM based on the temperature of the DRAM and based on calibration data determined using calibration tests performed on the DRAM while the SOC is coupled to the DRAM.

In a particular aspect, a device includes means for storing information, means for transferring information, and means for computing coupled via the means for transferring information to the means for storing information. The means for computing is configured to refresh the means for storing information at a particular refresh rate determined based on a temperature of the means for storing information and based on calibration data determined based on one or more calibration tests performed while the means for storing information is coupled to the means for computing.

One particular advantage provided by at least one of the disclosed aspects is that the refresh rate is based on data specific to a particular DRAM and a particular SOC. Thus, the DRAM may avoid performing refresh operations that may be necessary to keep other DRAMs refreshed, but that are not necessary to keep the particular DRAM refreshed, thereby saving power.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
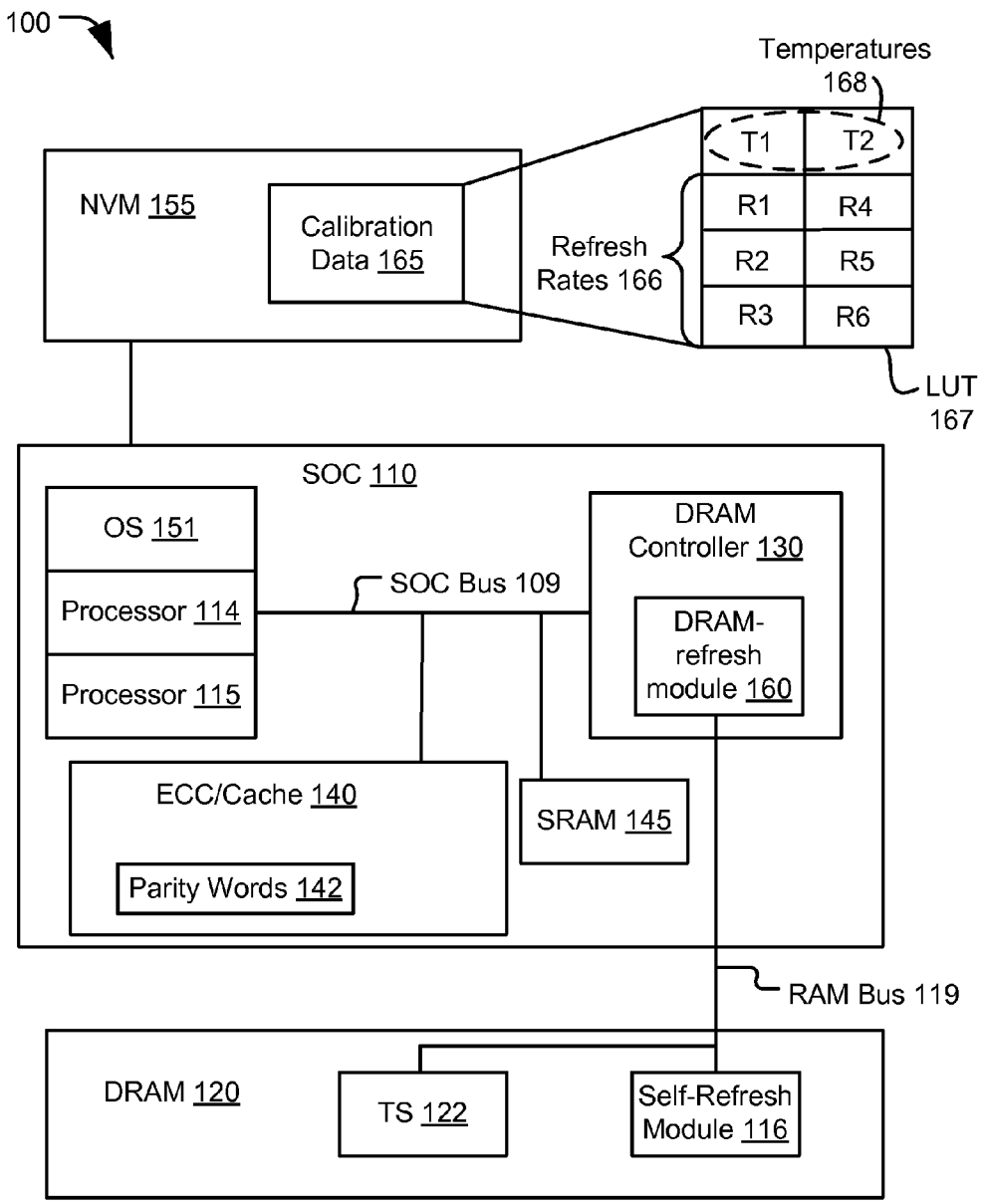
FIG. 1 is a block diagram of a particular illustrative example of a device including DRAM calibration data.

Referring to FIG. 1, a particular illustrative example of a device 100 including a system-on-chip (SOC) 110 coupled to a dynamic random access memory (DRAM) 120 is disclosed and generally designated 100. The SOC 110 may be coupled to the DRAM 120 via a bus (e.g., a random access memory (RAM) bus) 119. The SOC 110 may be configured to refresh the DRAM 120 to keep memory contents refreshed when the SOC 110 enters a power saving mode (e.g., a sleep mode or a standby mode).

The DRAM 120 includes a temperature sensor (TS) 122. The temperature sensor 122 may be configured to measure a temperature of the DRAM 120. The temperature sensor 122 may provide (e.g., via the RAM bus 119) a signal to the SOC 110 indicating the temperature of the DRAM 120. The DRAM 120 may include a self-refresh module 116 that is unused during refresh operations described herein. Alternatively, the DRAM 120 may not include the self-refresh module 116.

The SOC 110 may include an operating system (OS) 151, one or more processors 114 and 115, an error correction code (ECC) module 140 (e.g., an "ECC/cache module"), a DRAM controller 130 that includes a DRAM-refresh module 160, and a static random access memory (SRAM) 145. A bus (e.g., an SOC bus 109) may couple the one or more processors 114 and 115, the ECC/cache module 140, and the DRAM controller 130. The DRAM-refresh module 160 may be powered on a different power island than one or more other modules or components of the SOC 110. Thus, the DRAM-refresh module 160 may remain powered on (e.g., may receive power from a power supply of the different power island) while the SOC 110 is powered down in the power saving mode. Other modules or components of the SOC 110 may be powered down during the power saving mode. The DRAM-refresh module 160 is configured to refresh the DRAM 120 during the power saving mode at a refresh rate (determined by the SOC 110) based on the temperature of the DRAM 120 (e.g., as measured using the temperature sensor 122) and based on calibration data 165 determined based on calibration tests described in more detail below. The SOC 110 may be configured to determine, access, and/or store the calibration data 165. The calibration tests may be performed while the SOC 110 is coupled to the DRAM 120 (e.g., after the SOC 110 and the DRAM 120 are assembled in a consumer device).

The ECC/cache module 140 is used for performing read/write transactions at the DRAM 120. The ECC/cache module 140 is configured to compute parity data (e.g., parity bit sequences and/or one or more parity words 142) for write operations, to temporarily store the parity data, and to check the parity data for read operations as described in greater detail below. Each parity word of the one or more parity words 142 may include parity data corresponding to or generated for multiple write operations (e.g., parity data generated for multiple user data payloads). The ECC/cache module 140 may not be configured (or may not be used) to store user data associated with the write operations—thereby allowing the cache of the ECC/cache module 140 to be relatively small (e.g., compared to a cache that is configured to store user data and associated parity data). The DRAM 120 includes memory space to store parity bits computed by the ECC/cache module 140.

Calibration tests may be performed by or using the SOC 110. For example, the calibration tests may be performed using the SRAM 145, the one or more processors 114 and 115, and the DRAM controller 130. As an example, the SRAM 145 may store instructions that, when executed by the SOC 110 (e.g., using the processor 114), cause the SOC 110 to perform calibration operations of the calibration tests as further described below. Results of the calibration tests may correspond to a number of memory errors (e.g., an error rate) detected at different DRAM refresh rates and/or at different temperatures of the DRAM 120.

To illustrate, during a first calibration test, the SOC 110 and the DRAM 120 may be heated or cooled to a first temperature using an external temperature controller [not illustrated]. The SOC 110 may be configured to execute instructions (e.g., stored in the SRAM 145) to perform a "data fill" step including filling at least a portion of the DRAM 120 with a pattern of data and parity data for the first calibration test. For example, while the DRAM 120 is at the first temperature, the SOC 110 may write the data and the parity data from the SRAM 145 to the DRAM 120 using one or more write operations. The SOC 110 may also be configured to execute instructions (e.g., stored in the SRAM 145) to perform a "refresh rate configuration" step that causes the DRAM-refresh module 160 to refresh contents of the DRAM 120 at a first refresh rate while the DRAM 120 is at the first temperature. While the SOC 110 and the DRAM 120 are at the first temperature, the DRAM-refresh module 160 may refresh the DRAM 120 at the first refresh rate for a particular amount of time. The SOC 110 may be configured to perform a "data read" step including reading the data and the parity data from the DRAM 120 after the contents of the DRAM 120 have been refreshed at the first refresh rate for the particular amount of time. The SOC 110 (e.g., using the ECC/cache module 140) may be configured to perform a "check" step by analyzing/checking the data and the parity data read from the DRAM 120 to detect errors (e.g., error results detected during the "first calibration test"). The SOC 110 may be configured to perform a "data log" step including logging the error results detected during the first calibration test. For example, the SOC 110 may be configured to log the error results in the SRAM 145.

A second or additional calibration tests may be performed at one or more other refresh rates, at one or more temperatures, or both. Each calibration test may be performed multiple times (e.g., a particular number of times) at one or more of the refresh rates (e.g., multiple times at the first refresh rate and multiple times at the one or more other refresh rates). In some aspects, a calibration test may be performed multiple times at the refresh rates to gather error margin data. For example, a calibration test may be performed the particular number of times at the first refresh rate (e.g., at the first temperature) to collect a large enough sample size of error results at the first refresh rate to establish a reliable mean and standard deviation of error results for the calibration test performed at the first refresh rate.

The calibration tests may be performed for a set (e.g., a pre-determined set) of refresh rates and at a set (e.g., a pre-determined set) of temperatures. To illustrate, after completing the first calibration test or after performing the calibration test the particular number of times at the first refresh rate and at the first temperature, when one or more refresh rates of the set of refresh rates associated with the first temperature remains to be tested, the temperature of the DRAM 120 may be maintained, and one or more calibration tests may be performed at a different (e.g., a slower) refresh rate of the set of refresh rates at the first temperature. When all of the refresh rates of the set of refresh rates associated with the first particular temperature have been tested (e.g., have been tested the particular number of times), and one or more temperatures of the set of temperatures remain to be tested, the temperature of the DRAM 120 may be adjusted to an untested temperature of the set of temperatures, and one or more calibration tests may be performed for the set of refresh rates at the untested temperature. The above process may be performed iteratively until all temperatures of the set of temperatures have been tested and a sufficient sample size of error results is collected to provide statistics for all temperatures of the set of temperatures.

Alternatively or additionally, the calibration tests may be performed at successively slower refresh rates until a particular number of errors is identified at a particular temperature. For example, calibration tests may be performed at the first temperature at successively slower refresh rates until a single error is detected. Alternatively or additionally, the calibration tests may be performed at the first temperature at successively slower refresh rates until a greater number of errors than the ECC/cache module 140 can correct are detected. In response to detecting the particular number of errors at the first temperature, the temperature of the DRAM 120 may be adjusted to perform calibration tests at an untested temperature of the set of temperatures. The above process may be performed iteratively until all temperatures of the set of temperatures have been tested and a sufficient sample size of error results is collected to provide statistics for all temperatures of the set of temperatures.

The results of the calibration tests may correspond to or may be used to generate the calibration data 165. The calibration data 165 may be stored in or indexed in a look up table (LUT) 167. The LUT 167 may indicate a number of errors detected during calibration tests performed at a set of refresh rates 166 and at a set of temperatures 168, and may also include error margin data associated with each refresh rate of the set of refresh rates 166. In the illustrated example, the LUT 167 may be determined based on calibration tests performed at the set of temperatures 168 (e.g., a temperature T1 and a temperature T2) and the set of refresh rates 166. For example, the calibration tests may be performed using refresh rates R1, R2, and R3 while the DRAM 120 operates at the temperature T1 (as described below) and refresh rates R4, R5, and R6 while the DRAM 120 operates at the temperature T2. To illustrate, the calibration tests performed at the set of temperatures 168 and the set of refresh rates 166 may indicate that no errors are detected during performance of one or more calibration tests at the refresh rate R4 at the temperature T2, that one error is detected during performance of one or more calibration tests at the refresh rate R5 at temperature T2, and two errors are detected during performance of one or more calibration tests at the refresh rate R6 at the temperature T2. Although two temperatures are illustrated in the LUT 167, the LUT 167 may include more than two temperatures. Additionally or alternatively, although three refresh rates are illustrated for each temperature of the set of temperatures 168 of the LUT 167, in other examples, the LUT 167 may include more than or less than three refresh rates with respect to one or more temperatures of the set of temperatures 168 of the LUT 167.

The LUT 167 may be stored in the SOC 110, in a non-volatile memory ("NVM") 155, such as a flash memory, coupled to the SOC 110, or in the DRAM 120. Although the NVM 155 is illustrated as being attached to the SOC 110, in some implementations, the SOC 110 may include the NVM 155.

During operation in the power saving mode, the SOC 110 may be configured to refresh the DRAM 120 at a particular refresh rate based on the temperature of the DRAM 120 and based on the calibration data 165 determined based on one or more calibration tests performed while the SOC 110 is coupled to the DRAM 120 (e.g., as described above).

In some examples, the calibration data 165 may indicate, for each of a plurality of temperatures, an associated refresh rate that is not expected to result in any memory errors. In these examples, during operation in the power saving mode, the SOC 110 may be configured to determine a current temperature of the DRAM 120, to determine a temperature of the set of temperatures 168 (of the calibration data 165) that is nearest to the current temperature of the DRAM 120, and to determine a slowest refresh rate of the refresh rates 166 that is associated with the nearest temperature and that is not associated with any errors. As an example, the temperature T2 may correspond to 55° C. and the temperature T1 may correspond to 45° C. In this example, the SOC 110 may determine that a current temperature of the DRAM 120 is 52° C. Thus, the SOC 110 may access the LUT 167 and determine that the temperature of the temperatures 168 that is nearest to the current temperature of the DRAM 120 is the temperature T2. The SOC 110 may read the LUT 167 to determine that the slowest refresh rate (e.g., of the refresh rates 166) corresponding to the temperature T2 that did not result in any errors (during calibration) is refresh rate R4. The SOC 110 may determine to refresh the DRAM 120 at the refresh rate R4 based on the LUT 167 indicating that the slowest refresh rate (of the refresh rates 166) that did not result in any errors at the temperature T2 is the refresh rate R4. In this example, the SOC 110 may refresh the contents of the DRAM 120 at the refresh rate R4. Thus, the SOC 110 may be configured to refresh the DRAM 120 at the refresh rate R4 based on the temperature of the DRAM 120 and based on the calibration data 165 without using ECC during the power saving mode (e.g., without performing ECC check/correct operations during the power saving mode).

Alternatively or additionally, the SOC 110 may determine a refresh rate using the error margin data collected during the calibration tests. For example, the SOC 110 may be configured to determine a slowest refresh rate that is not expected to result in an error rate greater than, or a system availability less than, a threshold value. In some examples, the system availability may correspond to 1 minus the error rate (e.g., 1−error rate=system availability).

To illustrate, the SOC 110 may determine that the nearest temperature of the set of temperatures 168 is the temperature T2 as described above and the SOC 110 may read the LUT 167 to determine calibration data 165 and associated error margin data associated with the temperature T2. The SOC 110 may process the calibration data 165 and the error margin data associated with the temperature T2 (e.g., calibration data and error margin data associated with one or more of the refresh rates R4-R6 tested during calibration) to determine a slowest refresh rate that does not result in a system availability less than a threshold value. To further illustrate, the threshold value may correspond to a system availability of 0.9999966 (e.g., 1−error rate of 3.4 parts per million), the refresh rate R5 may correspond to 5 Hz (e.g., corresponding to refreshing at a rate of once every 200 milliseconds), and the calibration data 165 (including the associated error margin data) corresponding to the temperature T2 and the refresh rate R5 tested during calibration may indicate a mean (average) raw uncorrected error rate of one (1) bit failure every 200 milliseconds and a standard deviation (sigma σ) of seven (7) milliseconds. Based on the calibration data 165 and the error margin data associated with the temperature T2, the SOC 110 may apply a six sigma margin to the calibration data 165 associated with the refresh rate R5 to determine that a refresh rate of 6.329 Hz (e.g., 200 ms−6σ=158 ms) is the slowest refresh rate associated with the temperature T2 that corresponds to a system availability of 0.9999966. The SOC 110 may determine to refresh the DRAM 120 at the refresh rate of 6.329 Hz. Thus, the SOC 110 may determine to refresh the DRAM 120 at a refresh rate determined based on the temperature of the DRAM 120 and based on processing calibration data in conjunction with error margin data.

Alternatively or additionally to the SOC 110 processing the calibration data 165 and the associated error margin data during operation in the power saving mode, the slowest refresh rate that is not expected to result in a system availability less than the threshold value may be calculated prior to operation (e.g., at factory assembly) using results of the calibration tests. The LUT 167 may be populated with a refresh rate associated with the temperature T1 that is indicative of the slowest refresh rate that is not expected to result in a system availability less than the threshold value at the temperature T1 and a refresh rate associated with the temperature T2 that is indicative of the slowest refresh rate that is not expected to result in a system availability less than the threshold value at the temperature T2 (e.g., the refresh rate 6.329 Hz as described above). During operation in the power saving mode, the SOC 110 may access the LUT 167 and determine that the nearest temperature is the temperature T2 as described above, and the SOC 110 may determine the refresh rate associated with the temperature T2 in the LUT 167 is the refresh rate 6.329 Hz. The SOC 110 may determine to refresh the DRAM 120 at the refresh rate 6.329

Hz. Thus, the SOC 110 may determine to refresh the DRAM 120 at a refresh rate determined based on the temperature of the DRAM 120 and based on reading a refresh rate (from a look up table) that is determined using calibration data in conjunction with error margin data.

The SOC 110 may use ECC during the power saving mode to perform an ECC check/correct operation at a particular interval described below. The ECC check/correct operation may include reading and checking the DRAM 120 contents, correcting errors using the ECC/cache module 140 (e.g., correcting codeword errors), and re-writing back to DRAM 120 any codewords that had an error corrected (e.g., writing the corrected codewords to the DRAM 120). When a check of the DRAM 120 contents does not indicate an error, the ECC/cache module 140 may not correct and re-write data back to the DRAM 120 during the ECC check/correct operation.

In some examples, the particular interval may be different (e.g., longer) than the selected refresh rate. As an example, refreshing the DRAM 120 at the refresh rate R5 in the above example may provide substantially error free operation (e.g., may keep the contents of the DRAM 120 substantially error free) over a period of time (e.g., a "calculated duration") calculated based on an error margin of the calibration tests. However, the SOC 110 may operate in the power saving mode for a period of time exceeding the calculated duration. To reduce or eliminate errors when the SOC 110 operates in the power saving mode for a period of time exceeding the calculated duration, the ECC/cache module 140 may be configured to track an amount of time spent in the power saving mode and to perform an ECC check/correct operation when the SOC 110 is in the power saving mode for a period of time (e.g., a consecutive period of time) that exceeds the calculated duration. In these examples, the calibration data 165 may indicate a calculated duration and may indicate an associated refresh rate that is expected to result in a number of errors that is less than or equal to an error correction capability of the ECC/cache module 140 when the SOC 110 is in the power saving mode for a consecutive period of time corresponding to the calculated duration.

The calculated duration may correspond to an amount of consecutive time that the DRAM 120 can be refreshed at an associated refresh rate without resulting in more errors than the ECC/cache module 140 can correct. As an example, when the ECC/cache module 140 is capable of correcting a single error, and using the above-described six sigma margin that resulted in a raw system failure rate of 3.4 every one million R5 periods, the calculated duration may correspond to 12.9 hours (e.g., 3.4 failures every 43.89 hours or 1 failure every 12.9 hours). In this example, the SOC 110 may be configured to refresh the DRAM 120 at the refresh rate R5 (e.g., once every 158 milliseconds), and the ECC/cache module 140 may be configured to perform the ECC check/correct operation every 12.9 hours of time (e.g., consecutive time) spent in the power saving mode.

Alternatively or additionally, the calculated duration may correspond to a de-rated duration that is shorter than the amount of consecutive time that the DRAM 120 can be refreshed at an associated refresh rate without resulting in more errors than the ECC/cache module 140 can correct. For example, when the refresh rate is expected to result in one failure every 12.9 hours as described above, the calculated duration may be conservatively de-rated to a value less than 12.9 hours (e.g., the calculated duration may correspond to one hour). In this example, the SOC 110 may be configured to refresh the DRAM 120 at the refresh rate R5 (e.g., once every 158 milliseconds), and the ECC/cache module 140 may be configured to perform the ECC check/correct operation every 1 hour of time (e.g., consecutive time) spent in the power saving mode.

In other examples, the particular interval may correspond to a refresh rate. In these examples, the calibration data 165 may indicate a refresh rate that is expected to result in a number of errors that is less than or equal to an error correction capability of the ECC/cache module 140. For example, the SOC 110 may determine a current temperature of the DRAM 120 (e.g., by performing a temperature measurement or sampling data from a temperature sensor as described above), determine a temperature of the set of temperatures 168 that is nearest to the current temperature of the DRAM 120, and determine a slowest refresh rate of the set of refresh rates 166 at the nearest temperature that is associated with fewer errors than can be corrected using the correction capability of the ECC/cache module 140. In these examples, the SOC 110 (e.g., the ECC/cache module 140) may be configured to refresh the DRAM 120 at the determined slowest refresh rate and to perform the ECC check/correct operation during each refresh operation. To illustrate, the ECC/cache module 140 may employ an error correction scheme that is capable of correcting a single error (e.g., a single error per write operation or per user data payload). The SOC 110 may access the LUT 167 and determine that the temperature of the set of temperatures 168 that is nearest to the current temperature of the DRAM 120 is the temperature T1. The SOC 110 may read the LUT 167 to determine that the slowest refresh rate (e.g., of the set of refresh rates 166) corresponding to the temperature T1 that did not result in more than one error is the refresh rate R2. The SOC 110 may determine to refresh the DRAM 120 at the refresh rate R2 based on the LUT 167 indicating that the slowest refresh rate (of the set of refresh rates 166) corresponding to the temperature T1 that did not result in more errors than are correctible by the ECC/cache module 140 is the refresh rate R2. During each refresh operation, the ECC/cache module 140 may perform the ECC check/correct operation, e.g., the ECC check/correct operation may be performed at an interval corresponding to the selected refresh rate R2.

Thus, the SOC 110 may select a refresh rate based on a temperature of the DRAM 120, the calibration data 165, and a correction capability of the ECC scheme employed by the ECC/cache module 140, thereby limiting refresh power consumption while keeping the contents of the DRAM 120 refreshed during the power saving mode.

During operation in the active mode, the SOC 110 may be configured to operate in a first active mode or a second active mode. In the first active mode, the SOC 110 may be configured to selectively write parity data (e.g., the one or more parity words 142) to the DRAM 120. For example, the SOC 110 may be configured to write parity data from the ECC/cache module 140 to the DRAM 120 when the SOC 110 is about to change from the active mode to the power saving mode. Additionally or alternatively, the SOC 110 may be configured to write parity data from the ECC/cache module 140 to the DRAM 120 when the cache of the ECC/cache module 140 is full and new parity data replaces parity data that is no longer being used. Additionally or alternatively, the processor 114 may periodically or occasionally write cached parity data back to the DRAM 120 to synchronize parity data. Thus, the SOC 110 may be configured to write parity data from the ECC/cache module 140 to the DRAM 120 during the first active mode when certain conditions are met, which may reduce a number of ECC parity data write operations performed across the RAM bus 119.

To illustrate, when the SOC 110 is operating in the first active mode during a first write operation, the ECC/cache module 140 may be configured to compute parity data (e.g., "first parity data" or a "first parity bit sequence") associated with first data (e.g., "first user data") to be written during the first write operation. The ECC/cache module 140 may store the first parity data in the cache of the ECC/cache module 140 (e.g., as a portion of a parity word). The SOC 110 may be configured to provide the first user data via the RAM bus 119 to the DRAM 120 during the first write operation without writing the first parity data to the DRAM 120. Subsequently, during a second write operation, the ECC/cache module 140 may be configured to compute parity data (e.g., "second parity data" or a "second parity bit sequence") for second data (e.g., "second user data") to be written during the second write operation. The ECC/cache module 140 may store the second parity data in the cache of the ECC/cache module 140 (e.g., as a portion of the same parity word that includes the first parity data). The SOC 110 may be configured to provide the second user data via the RAM bus 119 to the DRAM 120 during the second write operation without writing the second parity data to the DRAM 120. Subsequently, when the SOC 110 determines (e.g., via the OS 151) that the SOC 110 is about to change from the active mode to the power saving mode, the first parity data and the second parity data stored in the ECC/cache module 140 may be written out to the DRAM 120 (via the RAM bus 119) by writing the parity word (e.g., a single parity word) that includes the first parity data and the second parity data. Thus, in the first active mode, parity data corresponding to multiple user data payloads may be selectively written to the DRAM 120 using a single write operation, thereby reducing the number of transactions over the RAM bus 119.

In the second active mode, caching of parity data at the ECC/cache module 140 may be disabled. Thus, in response to each write operation from the SOC 110 to the DRAM 120, both data (e.g., user data) and parity data may be written to the DRAM 120. Accordingly, when the SOC 110 is in the first mode, the SOC 110 may be configured to write parity data from the ECC/cache module 140 to the DRAM 120 only under certain conditions (such as when the ECC/cache module 140 is full, to synchronize parity data, or when the SOC 110 is transitioning to a power saving mode), and when the SOC 110 is in the second mode, the SOC 110 may be configured to write parity data to the DRAM 120 during every write operation.

In a particular implementation, the ECC/cache module 140 is configured to generate a codeword including a parity bit sequence (e.g., parity data) corresponding to each user data payload (e.g., parity data for each user data write operation). In some examples, such as when the ECC scheme employed by the ECC/cache module 140 is a single error correction (SEC) scheme where $2^m \geq m+k+1$, m is the number of parity bits and k is the number of data bits, a nine-bit parity sequence is required for each 256 bits of user data. To illustrate, the ECC/cache module 140 may generate a 9 bit parity sequence for each user data payload using a Hamming codeword of length N=265, data bits K=256, and parity bits M=9. In other implementations, such as when the ECC scheme employed by the ECC/cache module 140 is a double error correction scheme, parity bit sequences longer than 9 bits (e.g., 14 bit parity bit sequences) may be used.

The ECC/cache module 140 may be configured to generate parity words (e.g., a word-length set of parity data), such as the one or more parity words 142. In some examples, a parity word may have a length corresponding to a particular word-length of the DRAM 120. For example, when the DRAM 120 operates using a word-length of 32 bytes, the ECC/cache module 140 may assemble parity data associated with multiple write operations to generate parity words having a length of 32 bytes. Each parity word of the one or more parity words 142 may include a concatenation of the parity bit sequences, where each of the concatenated parity bit sequences corresponds to a parity bit sequence from a different codeword. Thus, the parity words generated by, and cached in, the ECC/cache module 140 may include parity data generated for a plurality of user data payloads (e.g., a plurality of parity bit sequences corresponding to the plurality of user data payloads). For example, when a parity bit sequence of nine bits in length is generated for each user data word, and the DRAM uses a word-length of 32 bytes (e.g., 256 bits), each parity word may include twenty-eight, nine-bit parity bit sequences (e.g., 28*9=252 bits) padded using an additional 4 bits. The DRAM 120 may be configured to store the parity words according to a first scheme (e.g., a "single split scheme") or according to a second scheme (e.g., a "distributed scheme") as described below with reference to FIGS. 2 and 3, respectively.

Figure 2:
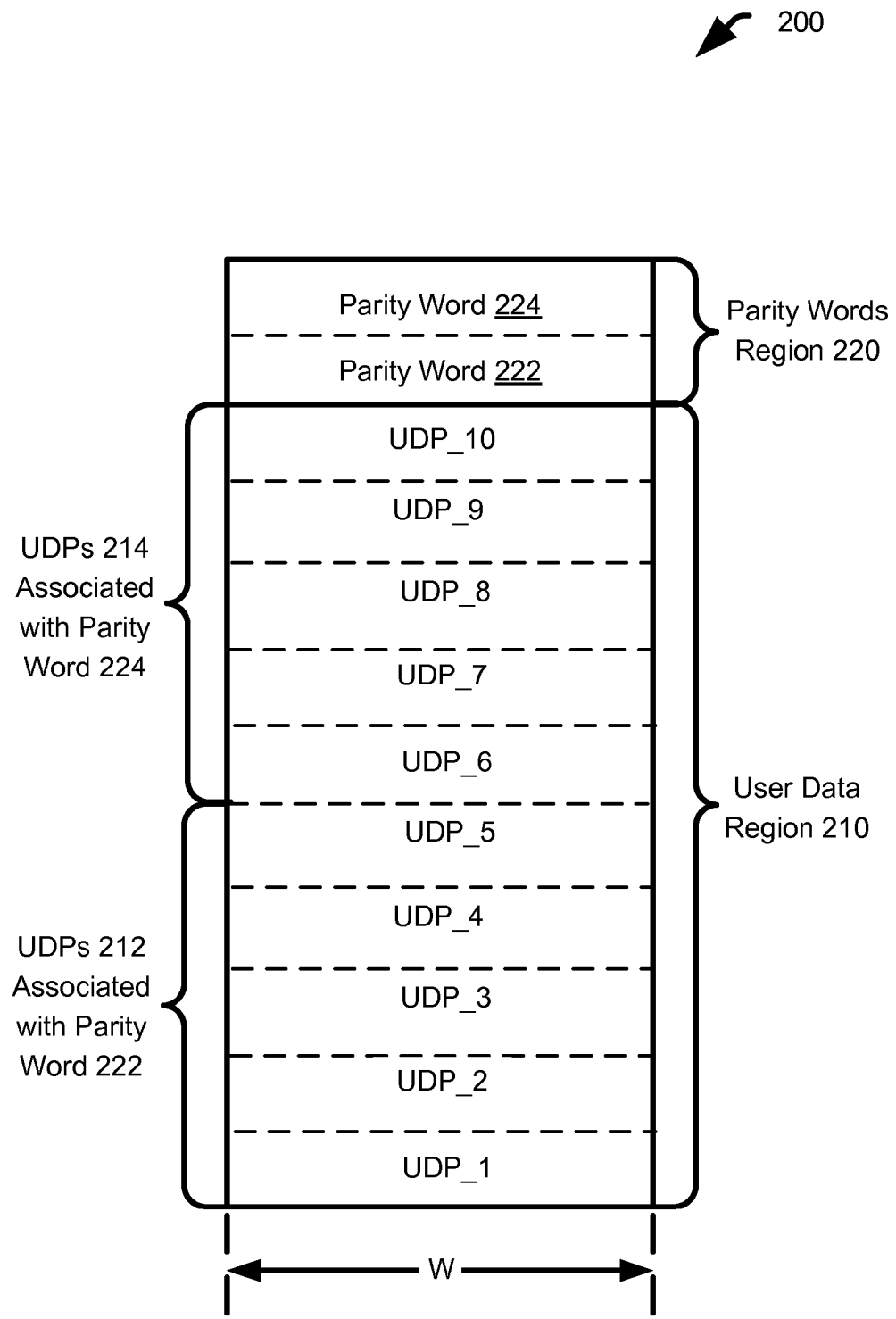
FIG. 2 is a block diagram that illustrates a first mapping scheme to map data in a DRAM.

FIG. 2 depicts a memory map 200 illustrating storage of parity words and user data in a DRAM according to a single split scheme. The DRAM may correspond to the DRAM 120 of FIG. 1 and the parity words may correspond to the one or more parity words 142 of FIG. 1. For example, FIG. 2 depicts storage of the one or more parity words 142 of FIG. 1 (e.g., the one or more parity words 142 generated by and cached in the ECC/cache module 140) and user data written from the SOC 110 to the DRAM 120 (e.g., during the active mode or during refresh operations described above). In the single split scheme, user data (e.g., user data payloads (UDPs)) associated with multiple parity words may be grouped together in (e.g., stored at) sequential memory addresses of the DRAM 120 of FIG. 1 (e.g., grouped together in a user data region 210 of FIG. 2). For example, a first parity word 222 may include parity data corresponding to UDPs 212 (e.g., including a UDP_1, a UDP_2, a UDP_3, a UDP_4 and a UDP_5), and a second parity word 224 may include parity data generated/associated with UDPs 214 (e.g., including a UDP_6, a UDP_7, a UDP_8, a UDP_9, and a UDP_10). The UDPs 212 associated with the first parity word 222 and the UDPs 214 associated with the second parity word 224 may be mapped to or stored at sequential memory addresses in the user data region 210. In the single split scheme, parity words may be grouped together in sequential memory addresses in a parity words region 220. For example, the first parity word 222 and the second parity word 224 may be stored at sequential memory addresses in the parity word region 220 of the DRAM 120 (of FIG. 1).

Although the parity words region 220 is illustrated as including two parity words, in other examples, the DRAM 120 of FIG. 1 may be configured to include a parity words region 220 that is configured to store more than two parity words. Although the user data region 210 is illustrated as including ten UDPs, in other examples, the DRAM 120 may include a user data region 210 configured to store more than ten UDPs, and each of the parity words may correspond to more than or less than 5 UDPs. In some examples, the user data region 210 may be configured to store N user data payloads, and the parity words region 220 may be configured to store N/Y parity words, where Y represents a number of parity bit sequences per parity word (e.g., a number of UDPs associated with each parity word). Thus, the parity words region 220 may comprise 100/Y percent of the memory of the DRAM 120 of FIG. 1. To illustrate, in a particular example, each parity word generated by the ECC/cache module 140 may have a length W (e.g., 32 bytes) and may include Y (e.g., twenty-eight) parity bit sequences of length Z (e.g., nine-bit parity sequences), where each of the Y parity bit sequences corresponds to a different UDP. In this example, the parity words region 220 may correspond to about 3.6% (e.g., 100/28%) of the memory of the DRAM 120 of FIG. 1.

Figure 3:
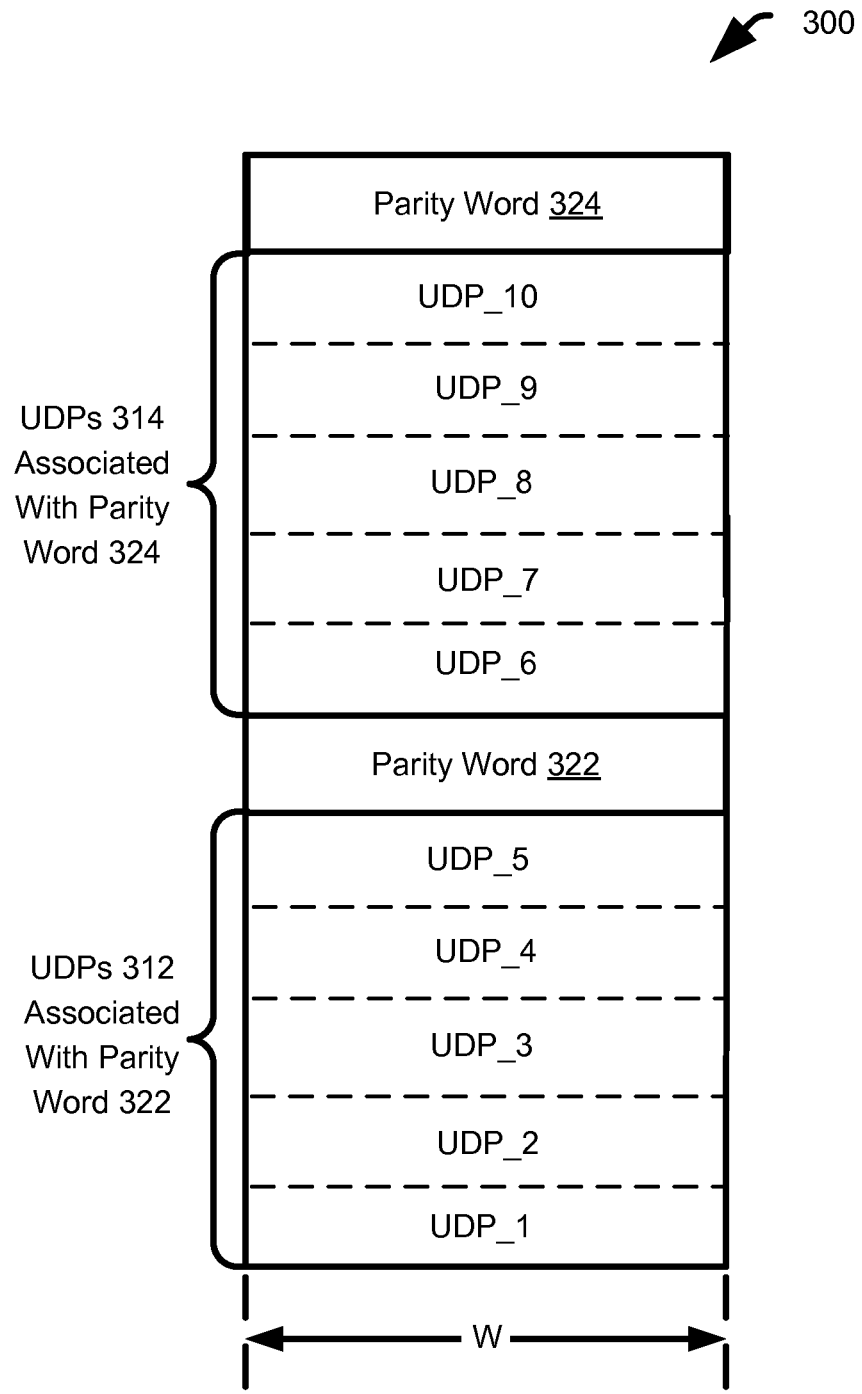
FIG. 3 is a block diagram that illustrates a second mapping scheme to map data in a DRAM.

FIG. 3 depicts a memory map illustrating storage of parity words and user data according to a distributed scheme. The DRAM may correspond to the DRAM 120 of FIG. 1 and the parity words may correspond to the one or more parity words 142 of FIG. 1. For example, FIG. 3 depicts storage of the one or more parity words 142 of FIG. 1 (e.g., the one or more parity words 142 generated by and cached in the ECC/cache module 140) and user data written from the SOC 110 to the DRAM 120 (e.g., during the active mode or during refresh operations described above). In the distributed scheme, each parity word is paired with (e.g., stored adjacent to) the parity word's respective user data (e.g., the parity word's respective UDPs) to form a parity/payload pair. For example, a first parity word 322 of FIG. 3 may include parity data corresponding to a plurality of UDPs 312 (e.g., a "first plurality of UDPs"), and a second parity word 324 may include parity data generated/associated with a plurality of UDPs 314 (e.g., a "second plurality of UDPs"). To illustrate, the plurality of UDPs 312 may include a UDP_1, a UDP_2, a UDP_3, a UDP_4, and a UDP_5, and the plurality of UDPs 314 may include a UDP_6, a UDP_7, a UDP_8, a UDP_9, and UDP_10. The plurality of UDPs 312 associated with the first parity word 322 may be mapped to sequential memory addresses in the DRAM 120 of FIG. 1, and the first parity word 324 may be mapped to a memory address of the DRAM 120 of FIG. 1 that is sequential to a memory address of at least one UDP of the plurality of UDPs 312. The plurality of UDPs 314 associated with the second parity word 324 may be mapped to sequential memory addresses in the DRAM 120 of FIG. 1, and the second parity word 324 may be mapped to a memory address of the DRAM 120 of FIG. 1 that is sequential to a memory address of at least one UDP of the plurality of UDPs 314.

Although each of the parity words 322 and 324 is illustrated and described as corresponding to parity data for five UDPs, in other implementations, each of the parity words 322 and 324 may correspond to more than or less than 5 UDPs. In some examples, the DRAM 120 of FIG. 1 may be configured to store N user data payloads and N/Y parity words, where Y represents a number of parity bit sequences per parity word (e.g., a number of UDPs that the parity word corresponds to). Thus, the parity words may correspond to 100/Y percent of the memory of the DRAM 120 of FIG. 1 as explained above with reference to FIG. 2.

Figure 4:
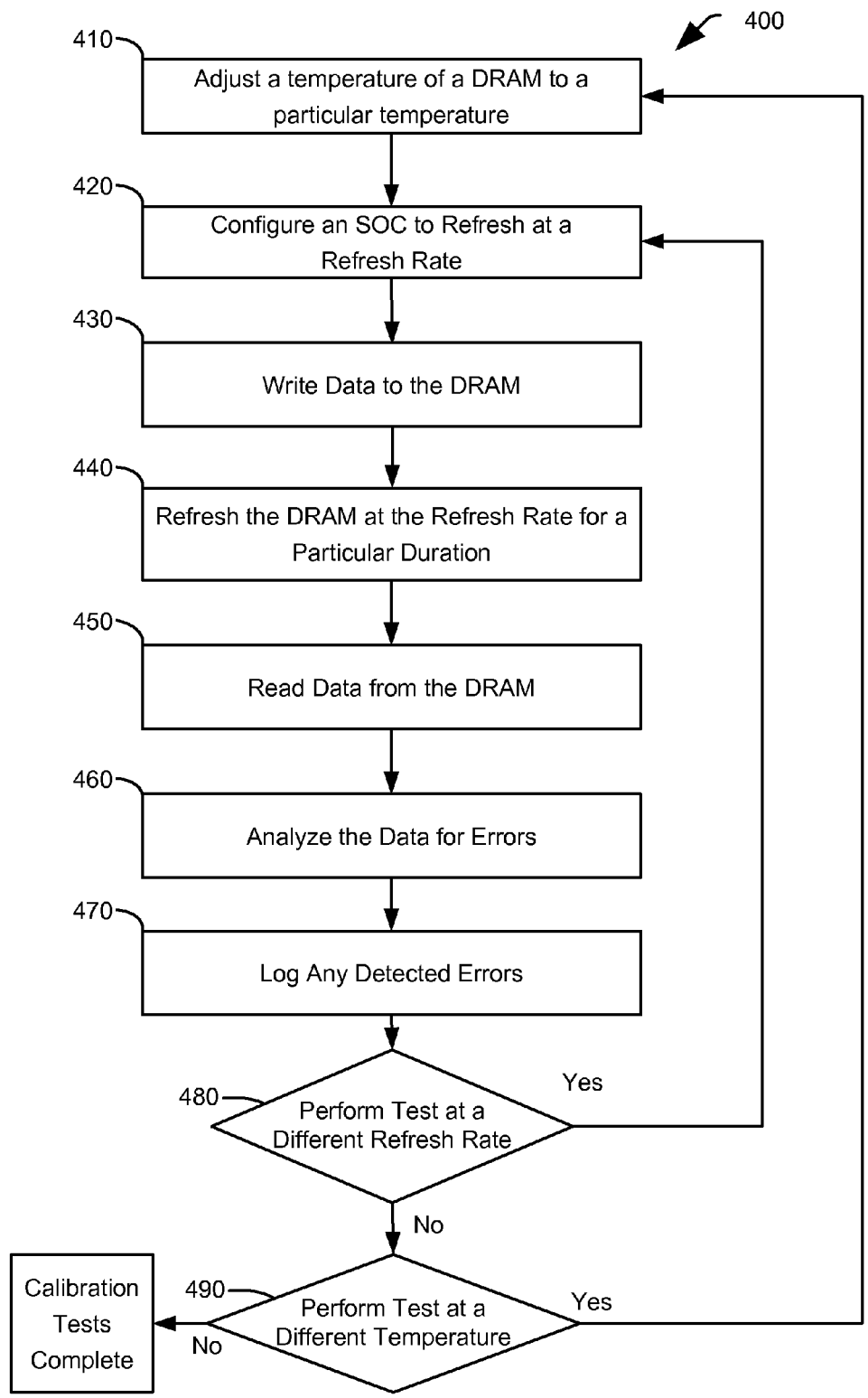
FIG. 4 is a flow chart of a particular illustrative example of a method of performing calibration tests on a DRAM at one or more temperatures or at one or more refresh rates while the DRAM is coupled to a system on chip (SOC)

A method 400 of performing calibration tests is illustrated in FIG. 4. The method 400 may be performed using the device 100 of FIG. 1 and an external heating or cooling element [not illustrated].

The method 400 includes, at 410, adjusting, during a first calibration test, a temperature of a DRAM to a particular temperature. For example, a temperature of the DRAM 120 may be measured (e.g., using the temperature sensor 122 of FIG. 1). When the DRAM 120 is not at the particular temperature as determined by temperature sensor 122, an external heating or cooling element [not illustrated] may be used to heat or cool the SOC 110 and/or the DRAM 120 of FIG. 1 to the particular temperature. The method 400 includes, at 420, configuring an SOC coupled to the DRAM 120 of FIG. 1 to refresh the DRAM 120 at a particular refresh rate for the first calibration test while the DRAM 120 and/or the SOC are at the particular temperature. For example, as described above, the SOC 110 may be configured to execute instructions (e.g., stored by the SRAM 145) that configure the DRAM controller 130 to refresh the DRAM 120 at the particular refresh rate for the first calibration test. The method 400 includes, at 430, writing data to the DRAM 120. For example, the SOC 110 may be configured to write a pre-determined pattern of data (e.g., data corresponding to user data and parity data) from the SRAM 145 to the DRAM 120 as described above with reference to FIG. 1. The method 400 includes, at 440, refreshing the DRAM 120 for a particular duration (e.g., a particular amount of time or a time based on a particular number of refresh operations) at the particular refresh rate while the DRAM 120 is maintained at the particular temperature. The method 400 includes, at 450, reading the data from the DRAM 120 after refreshing the DRAM 120 at the particular temperature for the particular duration. The method 400 includes, at 460, analyzing the data for the first calibration test (e.g., the data read from the DRAM 120 at 450). The method 400 includes logging errors detected in the data for the first calibration test at 470. Thus, the method 400 includes performing a first calibration test at a particular refresh rate at a particular temperature of the DRAM 120.

The method 400 further includes determining whether to perform one or more subsequent calibration tests at different refresh rates and/or different temperatures. For example, as described above, multiple calibration tests may be performed at different refresh rates at a particular temperature. Alternatively or additionally, multiple calibration tests may be performed at one or more refresh rates while the DRAM 120 of FIG. 1 is at different temperatures. For example, the method may include, at 480, determining whether one or more calibration tests remain to be performed at the particular temperature at a different refresh rate than the particular refresh rate. For example, when the calibration tests are performed at a pre-determined set of refresh rates, the method may include determining whether a calibration test has been performed for all of the refresh rates of the pre-determined set of refresh rates at the particular temperature. When the calibration test has not been performed for one or more refresh rates of the pre-determined set of refresh rates, the method 400 determines that one or more calibration tests at a different refresh rate of the pre-determined set of refresh rates remain to be performed at the particular temperature. Alternatively or additionally, as described above, in some examples, the calibration test may be performed at successively slower refresh rates at the particular temperature until a particular number of errors are detected at the particular temperature. In these examples, when the particular number of errors is not detected at the particular refresh rate, the method may determine that one or more calibration tests remain to be performed at a different refresh rate at the particular temperature.

When one or more calibration tests remain to be performed at a different refresh rate at the particular temperature, the DRAM 120 may be maintained at the particular temperature, the SOC may be configured to refresh the DRAM 120 at the different refresh rate, and the steps 430, 440, 450, 460, and 470 may be performed.

When it is determined at 480 that no further calibration tests remain to be performed at the particular temperature (e.g., when all refresh rates of the pre-determined set of refresh rates at the particular temperature have been tested or the particular number of errors has been detected), the method 400 may determine, at 490, whether one or more calibration tests (as described above) remain to be performed at one or more different DRAM 120 temperatures. For example, the method 400 may include determining that one or more calibration tests remain to be performed at one or more different DRAM 120 temperatures when calibration tests have been performed at all temperatures of a predetermined set of DRAM 120 temperatures. When the one or more calibration tests remain to be performed at the one or more different DRAM 120 temperatures, the temperature of the DRAM 120 may be adjusted to a next temperature of the one or more different DRAM 120 temperatures, and the steps 420, 430, 440, 450, 460, and 470 may be performed as described above. When it is determined that no further refresh rates and temperatures remain to be tested, the calibration tests are completed. Thus, the method 400 may include performing calibration tests on the DRAM 120 at different temperatures and different refresh rates prior to operation of the DRAM 120.

As described above, the calibration test may be performed multiple times (e.g., a particular number of times) at each of the refresh rates. For example, the first calibration test may be performed the particular number of times to collect a large enough sample size of error results at the first refresh rate to establish a reliable mean and standard deviation of error results for the calibration tests performed at the first refresh rate. The error margin data may supplement the stored logged error data described in step 470.

Figure 5:
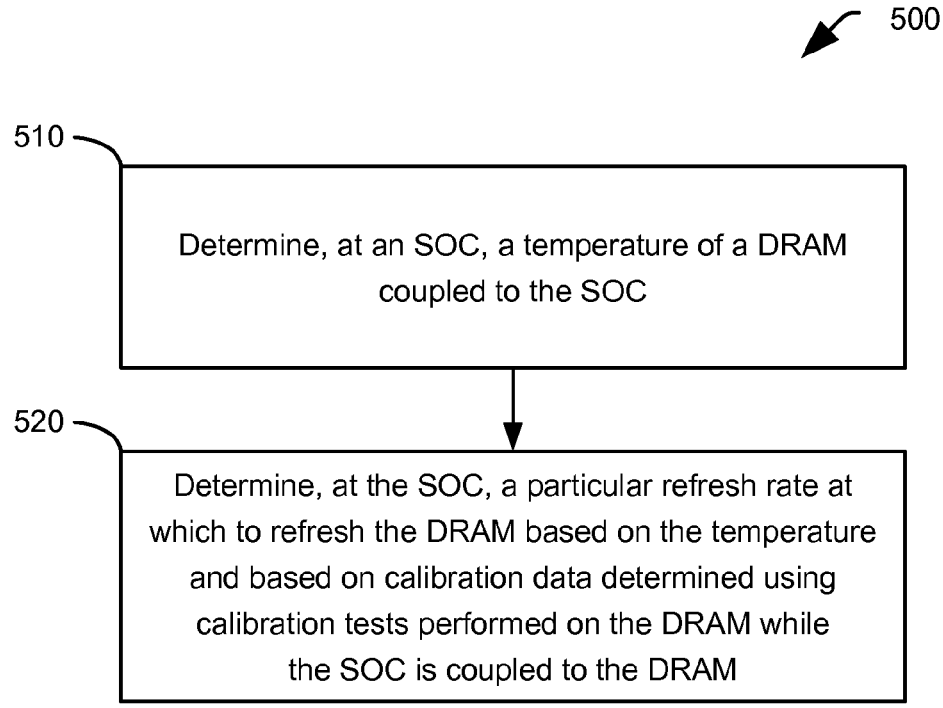
FIG. 5 is a flow chart of a particular illustrative example of a method of determining a refresh rate at which to refresh a DRAM based on a temperature of the DRAM and based on calibration data determined using calibration tests performed on the DRAM while an SOC is coupled to the DRAM.

Calibration data determined using results of the calibration tests may be used to select a refresh rate at which to refresh a DRAM during a power saving mode. A method 500 of refreshing a DRAM during a power saving mode using a refresh rate determined using calibration data determined using results of the calibration tests is illustrated in FIG. 5. The method 500 may be performed using the DRAM 120, the SOC 110, and the NVM 155 of FIG. 1. The method 500 includes, at 510, determining at the SOC 110, a temperature of the DRAM 120. For example, the temperature sensor 122 may measure a temperature of the DRAM 120 and the SOC 110 may read the temperature measured by the temperature sensor 122 to determine the temperature of the DRAM 120.

The method 500 includes, at 520, determining at the SOC 110, a particular refresh rate at which to refresh the DRAM 120 based on the determined temperature of the DRAM 120 and based on calibration data as described above with reference to FIG. 1. The calibration data may be determined using calibration tests performed on the DRAM 120 while the SOC 110 is coupled to the DRAM 120. The calibration data may correspond to the calibration data 165 of FIG. 1, and the SOC 110 may determine the particular refresh rate as described above with reference to FIG. 1. For example, the calibration data may be indexed in a LUT (e.g., the LUT 167 of FIG. 1) and determining the particular refresh rate may include accessing, by the SOC 110, the LUT 167 to determine a temperature represented in the LUT 167 that is nearest to the temperature of the DRAM 120 and to select a refresh rate associated with the temperature in the LUT 167. Thus, the method 500 may include determining a refresh rate at which to refresh the DRAM 120 based at least in part on calibration determined using calibration tests performed on the DRAM 120 while the SOC 110 is coupled to the DRAM 120.

Figure 6:
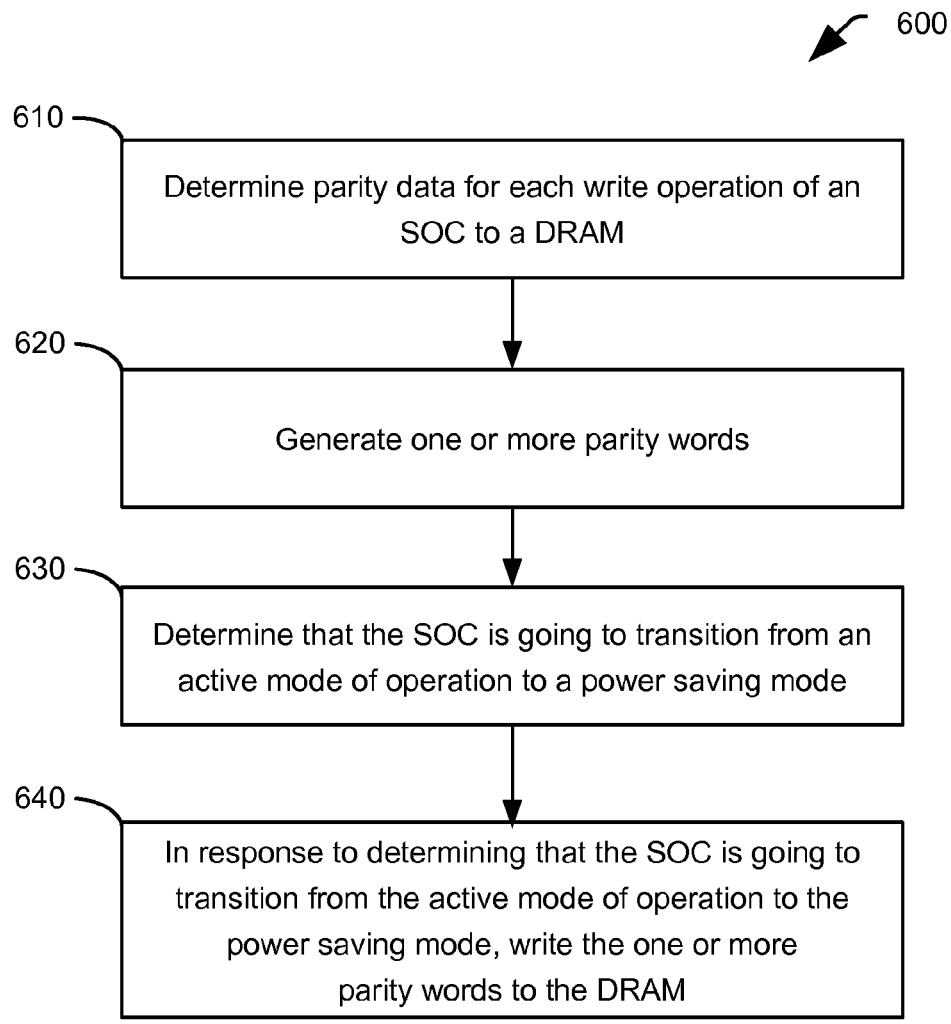
FIG. 6 is a flow chart of a particular illustrative example of a method of generating and writing parity data to a DRAM.

During operation in an active mode, an SOC may perform write operations to an external DRAM coupled to the SOC via a bus. For example, a write operation may include writing user data in a first transaction across the bus and writing parity data associated with the user data in a second transaction across the bus. Reducing a number of parity data transactions across the bus may improve performance by freeing the bus to perform user data transactions. A method 600 of determining and writing parity to a DRAM is illustrated in FIG. 6. The method 600 may be performed in conjunction with the method 400 of FIG. 4 and/or the method 500 of FIG. 5. The method 600 may be performed using the DRAM 120 and the SOC 110 of FIG. 1. The method 600 includes, at 610, determining, at the SOC 110, parity data for each write operation of the SOC 110 to the DRAM 120. For example, as described above, the ECC/cache module 140 may determine a parity bit sequence (e.g., of a Hamming codeword) for each user data payload written from the SOC 110 to the DRAM 120, where one user data payload is written per write operation from the SOC 110 to the DRAM 120.

The method 600 includes generating and caching one or more parity words at 620. For example, the ECC/cache module 140 may be configured to generate one or more parity words, where each parity word corresponds to parity data for multiple user data payloads (e.g., multiple write operations from the SOC 110 to the DRAM 120). Thus, the method 600 includes generating and caching parity words that include parity data corresponding to multiple write operations or user data payloads.

The method 600 includes determining that the SOC 110 is going to transition from an active mode of operation to a power saving mode at 630. For example, the OS 151 may indicate that the SOC 110 is going to transition to a power saving mode.

The method 600 includes selectively writing the one or more parity words to the DRAM 120 at 640 in response to determining that one or more conditions are satisfied. For example, the method 600 may determine that the SOC 110 is going to transition from an active mode to a power saving mode. For example, the OS 151 may determine that one or more conditions (e.g., after a period of inactivity or in response to user input) that correspond to triggering conditions to initiate transition from the active mode to the power saving mode have been satisfied. The method 600 may not write parity data to the DRAM 120 when the one or more conditions are not satisfied. Thus, the method 600 may reduce a number of write transactions across the bus by selectively writing parity data from the SOC 110 to the DRAM 120. Additionally, the method 600 may reduce a number of write transactions across the bus by concatenating parity data corresponding to multiple write operations or user data payloads into a single parity word as described above.

SOCs and DRAMs may be included in devices, such as wireless devices.

Figure 7:
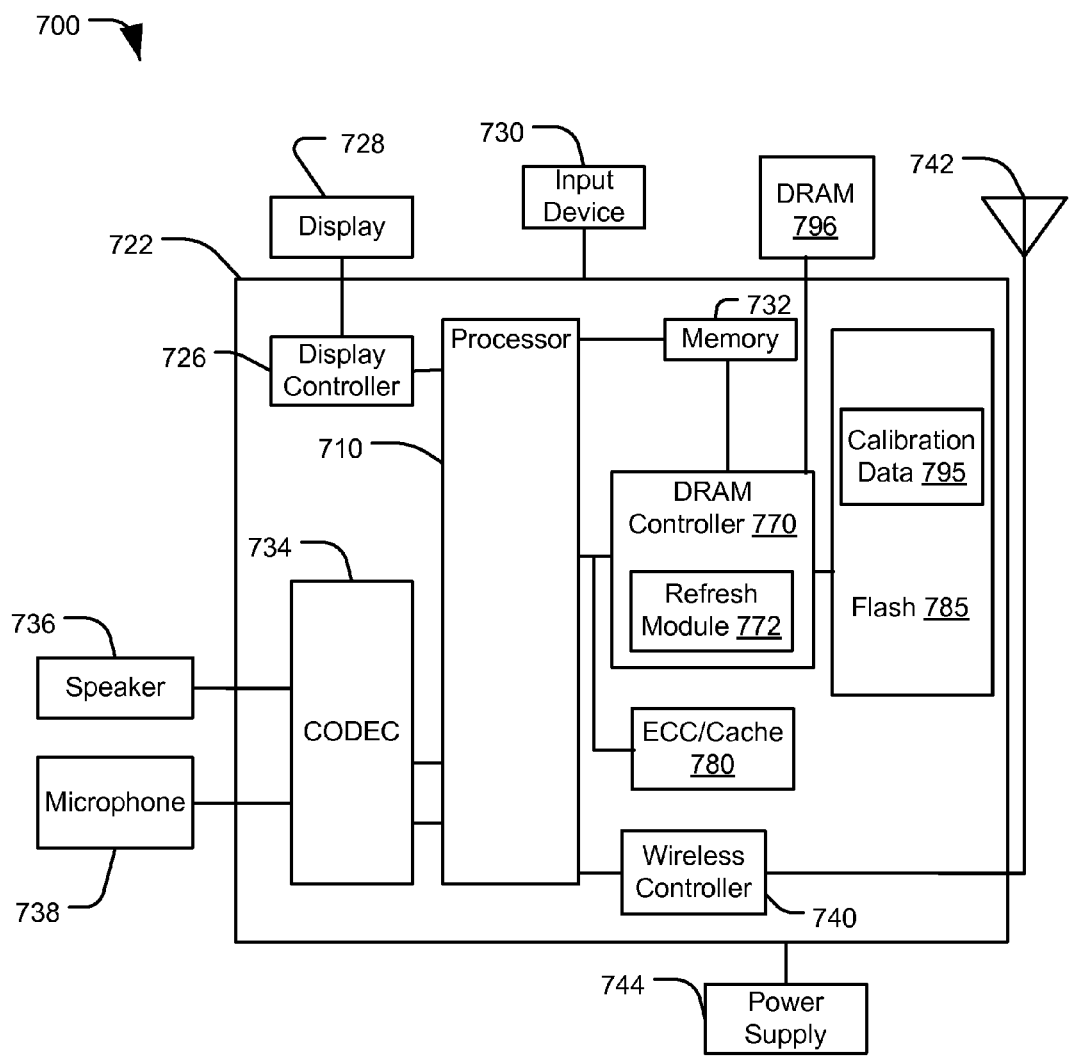
FIG. 7 is a block diagram of a device that includes DRAM calibration data.

Referring to FIG. 7, a block diagram of a particular illustrative example of a device (e.g., a wireless communication device) is depicted and generally designated 700. The device 700 includes a system on chip (SOC) 722 including a processor 710, such as a digital signal processor (DSP), coupled to a memory 732. The SOC 722 includes a DRAM controller 770 that includes a DRAM-refresh module 772. The SOC 722 includes a flash memory 785 that includes calibration data 795. The device 700 also includes a DRAM 796 coupled to the SOC 722. The DRAM 796, the DRAM controller 770, the DRAM-refresh module 772, the flash memory 785, and the calibration data 795 may correspond to the DRAM 120, the DRAM controller 130, the DRAM-refresh module 160, the NVM 155, and the calibration data 165, respectively, of FIG. 1, or may operate according to the methods of FIGS. 4, 5, and 6, or any combination thereof.

The calibration data 795 may be determined based on calibration tests performed while the SOC 722 is coupled to the DRAM 796. The DRAM controller 770 may be configured to control refresh operations of the DRAM 796. For example, when the SOC 722 is in a power saving mode, the DRAM controller 770 may refresh the DRAM 796 at a refresh rate based on a temperature of the DRAM 796 and based on the calibration data 795 as described above. Additionally, the ECC/cache module 780 may generate parity words as described above with reference to FIG. 1 (e.g., with reference to the one or more parity words 142 of FIG. 1). The SOC 722 may selectively write the parity words to the DRAM 796 as described above.

FIG. 7 also shows a display controller 726 that is coupled to the processor 710 and to a display 728. A coder/decoder (CODEC) 734 can also be coupled to the processor 710. A speaker 736 and a microphone 738 can be coupled to the CODEC 734.

FIG. 7 also indicates that a wireless controller 740 can be coupled to the processor 710 and to an antenna 742. In a particular implementation, the processor 710, the display controller 726, the memory 732, the CODEC 734, and the wireless controller 740 are included in the SOC 722. In a particular implementation, an input device 730 and a power supply 744 are coupled to the SOC 722. Moreover, in a particular implementation, as illustrated in FIG. 7, the display 728, the input device 730, the speaker 736, the microphone 738, the antenna 742, and the power supply 744 are external to the SOC 722. However, each of the display 728, the input device 730, the speaker 736, the microphone 738, the antenna 742, and the power supply 744 can be coupled to a component of the SOC 722, such as an interface or a controller.

In conjunction with the described examples, a system is disclosed that may include means for storing information, such as the DRAM 120 of FIG. 1, the DRAM 796 of FIG. 7, one or more other devices or circuits configured to store information, or any combination thereof. The system may also include means for transferring information, such as the RAM bus 119 of FIG. 1, one or more other devices or circuits configured to transfer information, or any combination thereof. The system may also include means for computing, such as the SOC 110 of FIG. 1, the SOC 722 of FIG. 7, one or more other devices or circuits configured to compute, or any combination thereof. The means for computing may be coupled via the means for transferring information to the means for storing information. The means for computing may include means for generating error correction code (ECC) data. The means for generating ECC data may correspond to the ECC/cache module 140 of FIG. 1 or the ECC/cache module 780 of FIG. 7.

The means for computing may be configured to refresh the means for storing information at a particular refresh rate determined based on a temperature of the means for storing information and based on calibration data. The calibration data may correspond to the calibration data 165 of FIG. 1 or the calibration data 795 of FIG. 7. The calibration data may be determined based on one or more calibration tests performed while the means for storing information is coupled to the means for computing as described above with reference to FIGS. 1 and 4.

For example, the calibration data may indicate, for each of a plurality of temperatures, an associated refresh rate that is not expected to result in any memory errors. In these examples, during operation in the power saving mode, the means for computing may be configured to determine a current temperature of the means for storing information and to determine a temperature represented in (or indicated by) the calibration data that is nearest to the current temperature of the means for storing information. The means for computing may be configured to determine a slowest refresh rate represented in (or indicated by) the calibration data that is associated with the nearest temperature and that is not associated with any errors.

In other examples, the calibration data may indicate, for each of a plurality of temperatures, an associated refresh rate that is not expected to result in more memory errors than are correctible by the means for generating ECC data. In these examples, during operation in the power saving mode, the means for computing may be configured to determine a current temperature of the means for storing information and to determine a temperature represented in (or indicated by) the calibration data that is nearest to the current temperature of the means for storing information. The means for computing may be configured to determine a slowest refresh rate represented in (or indicated by) the calibration data that is associated with the nearest temperature and that is not associated more errors than the means for correcting is capable of correcting.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a storage device, such as random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage known in the art. A storage device is not a signal. An exemplary storage device is coupled to the processor such that the processor can read information from, and write information to, the storage device. In the alternative, the storage device may be integral to the processor. The processor and the storage device may reside in an application-specific integrated circuit (ASIC). The ASIC may reside in a computing device or a user terminal. In the alternative, the processor and the storage device may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
a dynamic random access memory (DRAM);
a bus; and
a system-on-chip (SOC) coupled via the bus to the DRAM, the SOC configured to refresh the DRAM at a particular refresh rate based on a temperature of the DRAM and based on calibration data determined based on one or more calibration tests performed while the SOC is coupled to the DRAM.

2. The device of claim 1, wherein the SOC is configured to log results of the one or more calibration tests, the results corresponding to a number of memory errors detected at different DRAM refresh rates and different temperatures of the DRAM.

3. The device of claim 2, further comprising a non-volatile memory associated with the SOC, wherein the calibration data is indexed in a look up table stored in the non-volatile memory, and wherein the calibration data is determined based on the results logged by the SOC.

4. The device of claim 1, wherein the SOC includes an error correction code (ECC) module, and wherein the calibration data for a particular temperature indicates an associated refresh rate that is expected to result in a number of errors that is less than or equal to an error correction capability of the ECC module when the DRAM is operating at the particular temperature.

5. The device of claim 1, wherein the SOC includes an error correction code (ECC) module that is configured to generate parity data for each write operation of the SOC to the DRAM.

6. The device of claim 5, wherein the ECC module is configured to generate and store parity words having a length corresponding to a word-length of the DRAM.

7. The device of claim 6, wherein the parity words are stored in the DRAM at sequential memory addresses.

8. The device of claim 6, wherein each of the parity words includes a plurality of parity bit sequences corresponding to a plurality of user data payloads (UDPs).

9. The device of claim 8, wherein the plurality of UDPs is stored in the DRAM at sequential memory addresses.

10. A method comprising:
determining, at a system-on-chip (SOC), a temperature of a DRAM coupled to the SOC; and
determining, at the SOC, a particular refresh rate at which to refresh the DRAM based on the temperature of the DRAM and based on calibration data, the calibration data determined by calibration tests performed on the DRAM while the SOC is coupled to the DRAM.

11. The method of claim 10, further comprising logging, by the SOC, results of the calibration tests, the results corresponding to a number of memory errors at different DRAM refresh rates and DRAM temperatures.

12. The method of claim 11, wherein the calibration data is stored in a look up table and is generated based on the results.

13. The method of claim 12, wherein determining the particular refresh rate includes accessing, by the SOC, the look up table.

14. The method of claim 10, further comprising generating one or more parity words having a length corresponding to a word-length of the DRAM.

15. The method of claim 14, wherein each parity word of the one or more parity words includes parity data generated for multiple write operations of the SOC to the DRAM.

16. A device comprising:
means for storing information;
means for transferring information; and
means for computing coupled via the means for transferring information to the means for storing information, the means for computing configured to refresh the means for storing information at a particular refresh rate determined based on a temperature of the means for storing information and based on calibration data determined based on one or more calibration tests performed while the means for storing information is coupled to the means for computing.

17. The device of claim 16, wherein the means for computing is configured to log results of the calibration tests, the results corresponding to a number of memory errors at different temperatures of the means for storing information.

18. The device of claim 16, wherein the means for computing includes a means for generating error correction code (ECC) data, the means for generating the ECC data is configured to generate parity data for each write operation of the means for computing to the means for storing information.

19. The device of claim 18, wherein the means for generating the ECC data is configured to generate and store one or more parity words having a length corresponding to a word-length of the means for storing information.

20. The device of claim 19, wherein each parity word of the one or more parity words includes parity data generated for multiple write operations.

* * * * *